United States Patent [19]

Mahan

[11] Patent Number: 4,914,042
[45] Date of Patent: Apr. 3, 1990

[54] FORMING A TRANSITION METAL SILICIDE RADIATION DETECTOR AND SOURCE

[75] Inventor: John E. Mahan, Fort Collins, Colo.

[73] Assignee: Colorado State University Research Foundation, Fort Collins, Colo.

[21] Appl. No.: 177,772

[22] Filed: Apr. 5, 1988

Related U.S. Application Data

[62] Division of Ser. No. 913,354, Sep. 30, 1986, Pat. No. 4,782,377.

[51] Int. Cl.[4] ........................................... H01L 29/48
[52] U.S. Cl. ........................................... 437/2; 437/3; 437/5; 437/178; 437/51; 437/200; 148/DIG. 147; 148/DIG 139
[58] Field of Search .................... 437/2, 3, 4, 5, 178, 437/230; 148/DIG. 147, DIG. 139; 357/30 C, 30 G, 15

[56] References Cited

U.S. PATENT DOCUMENTS

| | | | |
|---|---|---|---|
| 3,841,904 | 10/1974 | Chiang | 437/178 |
| 3,927,225 | 12/1975 | Cordes et al. | 437/178 |
| 4,107,835 | 8/1978 | Bindell et al. | 437/39 |
| 4,180,596 | 12/1979 | Crowder et al. | 148/DIG. 147 |
| 4,214,017 | 7/1980 | Laitinen et al. | 437/230 |
| 4,533,933 | 8/1985 | Pellegrini et al. | 357/30 |
| 4,803,539 | 2/1989 | Psaras et al. | 357/15 |

OTHER PUBLICATIONS

Silicides for VLSI Application by S. P. Murarka 1983, pp. 115–131.
Maria Ronay, Reinvestigation of First Phase Nucleation in Planar Metal-Si Reaction Couples; Appl. Phys. Lett. 42(7), Apr. 1, 1983, pp. 577-579.
Marc-A. Nicolet; Formation and Characterization of Transition-Metal Silicides; VLSI Electronics: Microstructure Science, vol. 6, 329-464.
B. Y. Tsaur, S. S. Lau, J. W. Mayer, and M.-A. Nicolet; Sequence of Phase Formation in Planar Metal-Si Reaction Couples; Appl. Phys. Lett. 38(11), Jun. 1, 1981; pp. 922-924.
R. W. Bené; First Nucleation Rule for Solid-State Nucleation in Metal-Metal Thin-Silm Systems; Appl. Phys. Lett. 41(6), Sep. 15, 1982; pp. 529-531.
R. W. Bower and J. W. Mayer, Growth Kinetics Observed in the Formation of Metal Silicides on Silicon; Appl. Phys. Lett., vol. 20, No. 9, May 1972; pp. 359-361.
K. Nakamura, J. O. Olowolafe, S. S. Lau, M-A. Nicolet, and J. W. Mayer; Interaction of Metal Layers with Polycrystalline Si; Journal of Applied Physics, vol. 47, No. 4, Apr. 1976; pp. 1278-1283.
G. J. van Gurp; The Growth of Metal Silicide Layers on Silicon; Semiconductor Silicon 1977, Proceedings vol. 77-2; pp. 342-358.
R. Anderson, J. Baglin, J. Dempsey, W. Hammer, F. d'Heurle, and S. Petersson; Nucleation-Controlled Thin-Film Interactions: Some Silicides; May 23, 1979.
G. Ottaviani and K. N. Tu; Phase Separation in Alloy-Si Interaction; Appl. Phys. Lett. 36(4), Feb. 15, 1980; pp. 331-333.

(List continued on next page.)

Primary Examiner—Brian E. Hearn
Assistant Examiner—Tuan Nguyen
Attorney, Agent, or Firm—Dorr, Carson, Sloan & Peterson

[57] ABSTRACT

Transition metal silicide semiconductor electromagnetic radiation source and detectors have a thin film of semiconducting silicide grown or deposited on a silicon wafer. The transition metals are chosen from a group consisting of iron, iridium, manganese, chromium, rhenium, barium, calcium, magnesium and osmium. The detectors are intrinsic and can be formed either as discrete devices, monolithically or in array on a silicon chip to provide an integrated detector. The transition metal silicide semiconductors are efficient detectors at wavelengths which mate with the transmission capabilities of certain optical fibers enhancing the combination of infra-red detectors and optical fiber transmission previously unknown. Iron disilicide is useful as an infrared radiation source and as an extrinsic detector as well.

4 Claims, 6 Drawing Sheets

OTHER PUBLICATIONS

G. Ottaviani and K. N. Tu; Interfacial Reaction and Schottky Barrier in Metal-Silicon Systems; 1980 The American Physical Society, vol. 44, No. 4, Jan. 28, 1980; pp. 284–287.

G. Ottaviani; Phase Formation and Kinetic Processes in Silicide Growth; Mat. Res. Soc. Symp. Proc., vol. 25 (1984); pp. 21–31.

G. W. Rubloff and R. M. Tromp; Material Reaction and Silicide Formation at the Refractory Metal/Silicon Interface; Appl. Phys. Lett. 48(23), Jun. 9, 1986; pp. 1600–1602.

FORMING A TRANSITION METAL SILICIDE RADIATION DETECTOR AND SOURCE

CROSS-REFERENCE TO RELATED APPLICATIONS

This application is a division of application Ser. No. 913,354 filed Sept. 30, 1986 now U.S. Pat. No. 4,782,377.

FIELD OF THE INVENTION

The present invention relates to a novel electromagnetic radiation detector made from a thin film of iron disilicide and other semiconducting silicide compounds grown or deposited on a silicon wafer or other suitable substrate. The invention relates to the discovery of iron disilicide ($FeSi_2$), iridium silicide ($IrSi_{1.75}$), manganese silicide ($MnSi_{1.7}$), chromium disilicide ($CrSi_2$), rhenium disilicide ($ReSi_2$), magnesium silicide ($Mg_2Si$), barium disilicide ($BaSi_2$), calcium silicide ($Ca_2Si$) and osmium disilicide ($OsSi_2$) as effective intrinsic electromagnetic radiation detectors and sources. The invention also relates and to the combination of these intrinsic electromagnetic radiation detector and source devices with electronics on a single chip of an integrated circuit having both electronic data processing and memory and electromagnetic radiation information receiving, processing or transmitting capability. The invented devices can also act as chip interconnects. The present invention is the first to fabricate, and demonstrate the semiconducting nature of, a thin film of rhenium disilicide. All of the above listed metal silicides except osmium and calcium silicides are effective in the infra-red region. Calcium and osmium silicides are effective in the visible light region of the electromagnetic spectrum.

BACKGROUND OF THE INVENTION

The present invention relates to devices which are capable of (1) exhibiting decreased electrical resistance or (2) generating a current or voltage when exposed to electromagnetic radiation or (3) emitting electromagnetic radiation when electrical current is passed. Theses types of devices when exposed to radiation of suitable wavelength, generate electric current or voltage. When electric current is passed through them, they generate radiation of infra-red or shorter wavelengths depending on the value of the semiconducting energy gap. Iron disilicide now appears to be the one of the above-listed metal silicide radiation sources that exhibits the best performance. Infra-red radiation emitted by these radiation sources ranges in wavelengths from 0.77 microns to 1000 microns.

There are numerous applications for infra-red detectors; one is for terrestrial imaging from space. The limited wavelengths which can be transmitted through the atmosphere are approximately 1.5 to 1.9; 2.0 to 2.6; 3.4 to 4.5 to 5.0 and 8 to 13 microns. NASA has shown an interest in the 2.5 to 30 micron wavelength range. Another application for the present invention is in combination with fiber optic systems using silica based fibers (which in long haul, high capacity systems have narrow spectral windows centered on about 1.3 and 1.55 microns). A short haul system has an additional spectral window from about 0.8 to 0.9 microns as well as the windows at about 1.3 and 1.55 microns. In such applications, the output of the infra-red sources can be applied directly to the fiber optics for transmission to an infrared detector and its associated processor. Since the intrinsic electromagnetic radiation detector and source devices are silicon-compatible, they can be combined on the same chip as other silicon based elements such as data storage and data processing elements. In such a combination, the signal processing and related computing can be performed on the very same chip that holds the source, detector, imaging or detector array. Monolithic systems afford many advantages compared to hybrid systems.

The detectors can be arranged singly or in an array. A two dimensional array can be constructed. Each element in the array has an output which can converted into a digital electrical signal.

Practical devices currently available include intrinsic infra-red semiconductor detectors as discrete devices or linked to electronic circuitry in some form other than on a single silicon chip. Schottky barrier infra-red detectors are also available and workable but are slow for communication purposes and have relatively low quantum efficiency compared to the devices of the present invention. The Schottky barrier are of limited wavelength range. They have been integrated on a silicon chip.

Silicon intrinsic detectors are effective for visible light and perhaps can be extended in time to wavelengths up to about 0.9 microns. Extrinsic silicon detectors are sensitive to much longer wavelengths, but have absorptive coefficients of 1000 to 10,000 times lower than those of intrinsic detectors.

Germanium and germanium-silicon alloys can be grown on a silicon wafer. The absolute long-wavelength limit for germanium based alloys is 1.0 microns and virtually pure germanium has a value of about 1.9 microns. However, germanium and germanium-silicon alloys are relatively weak absorbers of infra-red radiation compared to the transition metal silicide semiconductors described herein. Special structures, such as wave guides, must be developed to use both germanium and germanium-silicon alloys as thin films. The wave guides and other structures are necessary because such devices are weak absorbers of infra-red radiation.

There is also available a family of Mercury-Cadmium-Tellurium devices for infra-red detection. These devices operate without being able to be combined, to date, with an effective microelectronics technology as is possible with silicon based devices.

The devices described above have been effective to some extent. However, there still remains a need for detectors meeting all of the following characteristics:

(1) The efficiency of an intrinsic semiconductor detector;

(2) Efficient operation in the previously described spectral ranges; and, (3) Practical fabrication on a silicon chip in a monolithic structure. The need for such devices has been recognized by persons skilled in this art and some attempts have been made recently to fabricate such a device using gallium arsenide (GaAs) and related compounds on a silicon substrate. However, these materials are not currently compatible with silicon processing.

The semiconducting metal silicide devices meet all of these criteria for radiation detectors and radiation sources. There also remains a need for radiation sources which exhibit high efficiencies and may be practically fabricated on a silicon ship in a monolithic structure. Again, GaAs and related compounds are under investigation. However, such materials are not currently compatible with silicon processing.

DESCRIPTION OF THE INVENTION

Figure 1:
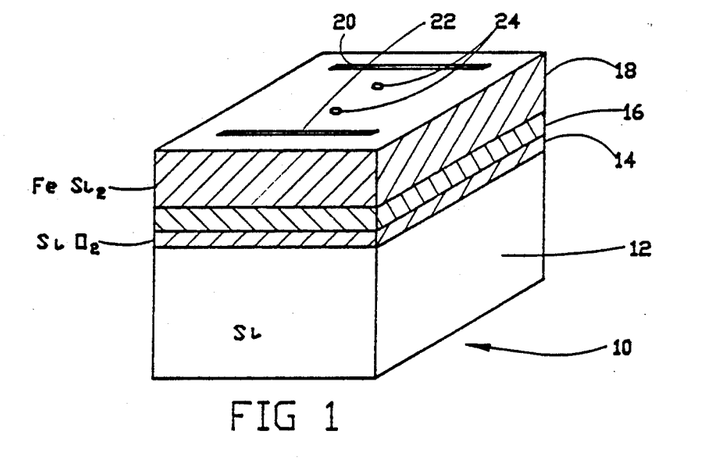
FIG. 1 shows a perspective view of one embodiment of the present invention showing a metal silicide semiconductor infra-red radiation detector.

FIG. 1 shows a perspective view of one embodiment of the present invention being formed of a semiconducting metal silicide shown by the numeral 10. The substrate 12 is a silicon wafer thermally oxidized to grow 1000 angstroms more or less of insulating oxide 14. The oxide layer 14 is then coated with several thousand angstroms of polycrystalline silicon film 16. This polycrystalline silicon film is added commonly by low pressure vapor deposition. A thin film of metal is then added to the polycrystalline silicon film 16 and then reacted by heating the sample in an inert environment to react the metal film with the layer below to form a semiconducting metal silicide 18. Electrical contact with the semiconducting metal silicide is achieved by depositing an aluminum or other conductive film 20, 22 and 24 on the semiconducting metal silicide which is then photolithographically patterned.

Other insulating substrates can be used and coated with a silicon film. The metal deposition technique can be evaporation or chemical vapor deposition. Furthermore, the silicide film may be formed by (simultaneous) codeposition of metal and silicon.

Figure 6:
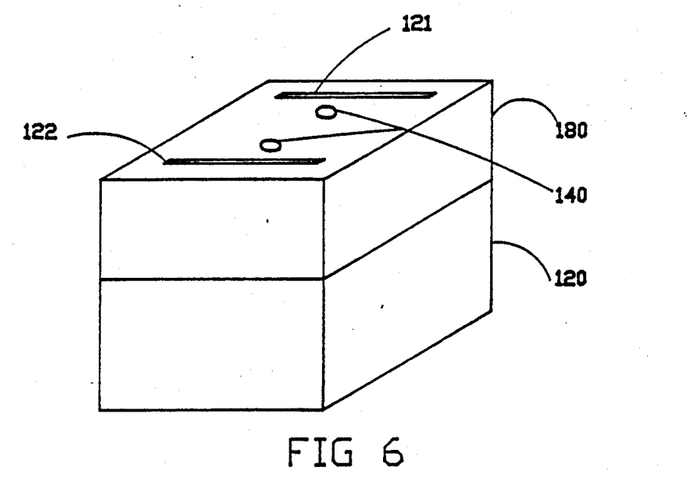
FIG. 6 is a perspective view of another embodiment of the present invention showing the metal silicide layer deposited directly on the silicon substrate.

FIG. 6 shows a another embodiment of the present invention having a substrate 120 on top of which is formed a thin film metal silicide 180. Conductive pads 121, 122 and 140 are formed on the surface of the thin film metal silicide 180.

The metal can be chosen from the group consisting of: iron, iridium, manganese, chromium, rhenium, magnesium, calcium, barium or osmium. The silicides formed are: iron disilicide ($FeSi_2$), iridium silicide ($IrSi_{1.75}$), manganese silicide ($MnSy_{1.7}$), chromium disilicide ($CrSi_2$), rhenium disilicide ($ReSi_2$), magnesium silicide ($Mg_2Si$), barium disilicide ($BaSi_2$), calcium silicide ($Ca_2Si$) or osmium disilicide ($OsSi_2$) respectively.

The process for forming each metal silicide should vary as to annealing temperature and time. The chart 1 shown below shows the time, temperature and a range of thickness for the metal silicides. Each metal silicide thus made has been tested and shown to be a true semiconductor which demonstrates useful radiation detection properties based either on analysis of the data showing the optical absorption edge for each material together with measurements of electrical resistivity as a function of temperature. Iron disilicide is a photoconductive infra-red detector.

| Element | Temp./Time (minutes) | Thickness (Angstroms) |
| --- | --- | --- |
| Chromium | 900 C./120–1100 C./120 | 1000–13,000 |
| Manganese | 800 C./120–1000 C./60 | 1900–15,000 |
| Iridium | 750 C./120–850 C./120 | 1355–5,418 |
| Rhenium | 900 C./120 | 307–768 |
| Iron | 900 C./120 | 700–3,200 |

The data showing the optical absorption edges for various materials are shown in Appendix "A" which consists of figures showing data for iron disilicide, manganese silicide, chromium disilicide, iridium silicide and rhenium disilicide.

The active metal silicide layer can be made by depositing a thin film of the desired metal onto a silicon wafer which has been polished and cleaned for integrated circuit fabrication. It is important to have a clean metal-silicon interface before annealing. After heating to the proper temperature and for the proper time, the metal film will react with the silicon substrate to form a metal silicide semiconductor. The semiconducting metal silicide film may also be grown on a polycrystalline silicon surface.

For example, rhenium disilicide ($ReSi_2$) was prepared by ion beam sputtering of rhenium film onto 1-0-0 polished silicon wafers. The silicide layer was grown by reaction of the metal film with the silicon substrate at 900 degrees C. in an inert environment of flowing argon gas. The substrate is ion-milled in vacuum immediately prior to metal deposition. Appendix "B" attached hereto and forming a part of this application gives a detailed description of the fabrication of iron disilicide. A similar process is used for the formation of the other transition metal silicides with annealing times and temperatures varying in a similar fashion as set forth in Chart 1. Naturally, variations of these parameters are certainly possible even for those materials listed in Chart 1.

Figure 2:
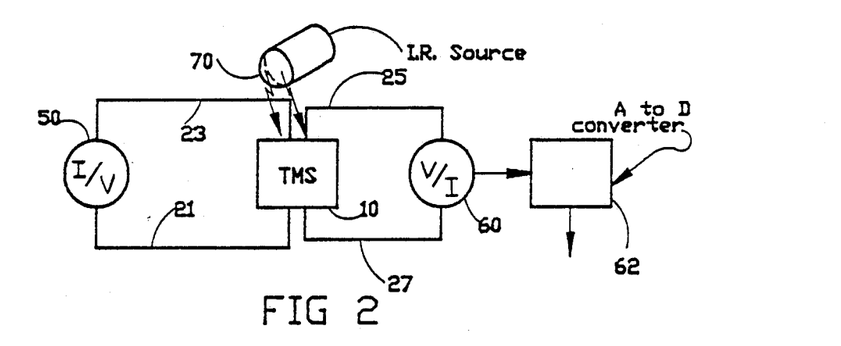
FIG. 2 shows a view of a circuit using the detector shown in FIG. 1.

FIG. 2 shows a circuit used with the device shown in FIG. 1. The conductive pads 20, 22 formed on the semiconducting metal silicide layer shown in FIG. 1 are by wires 21, 23 connected to a current source 50. Conductive pads 24 of FIG. 1 are connected by wires 25, 27 to a voltmeter 60. A source of infra-red radiation 70 illuminates semiconducting metal silicide device 10. The metal silicide resistance of the device 10 drops as it is exposed to radiation to that the voltage detected by voltmeter 60 drops as a function of the intensity of infra-red radiation from infra-red radiation source 70. An analog-to-digital converter 62 is shown receiving information from voltmeter 60 for digitizing the output of the metal silicide infra-red detector.

Figure 3:
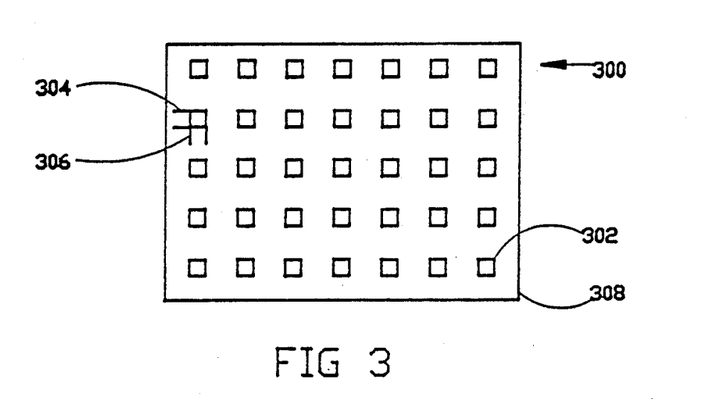
FIG. 3 shows an array of devices shown in FIG. 1 forming another embodiment of the present invention.

FIG. 3 shows an array of devices of the type shown in FIG. 1. The array shown generally by the number 300 is formed of twenty-five metal silicide semiconductors 302. Each semiconducting metal silicide device 302 has leads 304 into which a constant current can be fed from a current source—not shown—. Each semiconducting metal silicide device 302 also has leads 306 from which the voltage drop across the device can be measured or detected. The array 300 is grown on a substrate 308 which can be formed of a wide variety of materials including silicon. If silicon is the chosen substrate, the entire array can be formed monolithically. In that case the leads 304, 306 would be formed on the substrate photolithographically by techniques well known in the semiconductor fabricating industry.

Figure 4:
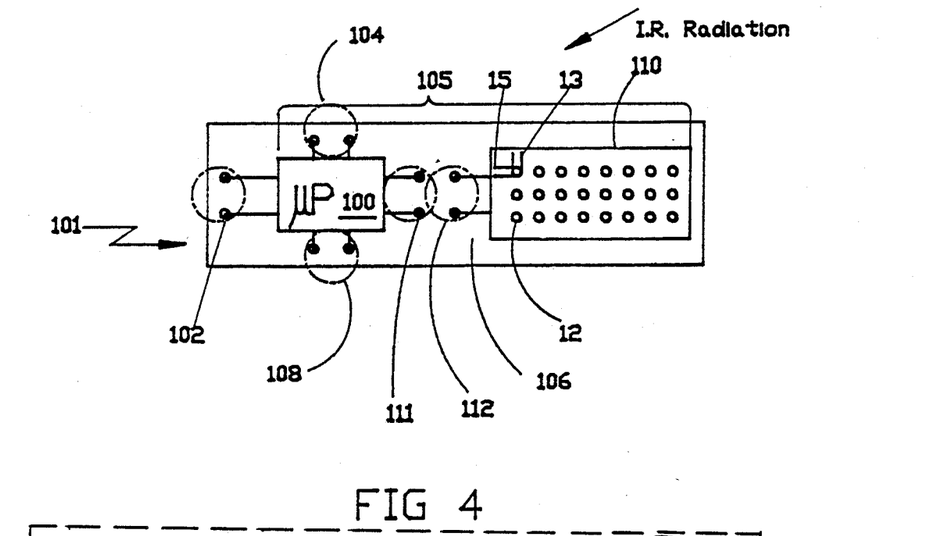
FIG. 4 shows an array of devices, as shown in FIG. 3, formed on a common silicon substrate with a very large scale integrated circuit forming another embodiment of the present invention.

FIG. 4 shows an integrated circuit array 101 formed of microprocessor circuitry 100 (or other VSLI device) and a transition metal silicide semiconductor infra-red detector array 110 shown for the purposes of illustration only as a separate element. One use of such a device is incoming missile detection and ranging. Currently, such combinations of infra-red detection and computer analysis of the incoming signals are performed by interconnecting discrete devices. The discrete devices each perform satisfactorily but are not as fast, compact, low cost to make, or reliable as a single integrated device. The potential speed difference is substantial, perhaps 100 times that of present devices. The quality of the electric interconnects is an important factor in the speed of the device. Similarly, the integrated system is more rugged, faster and more reliable than a hybrid system formed of discrete devices. The net result is that such devices could be hand held or easily portable. The increased speed of data processing, the ruggedness and reliability can be critical in military and space use.

FIG. 4 shows the array as a two dimensional array of metal silicide source device 12 whose output is represented by the bundle of leads 112 which contain data fed to microprocessor circuitry 100. Microprocessor circuitry 100 fabricated on substrate 106 receives power through leads 102 and transmits information via leads 104. Additional data and control information may be placed into the microprocessor 100 by leads 108. The entire integrated circuit 105 is fabricated on a substrate 106 typically of silicon.

Figure 5:
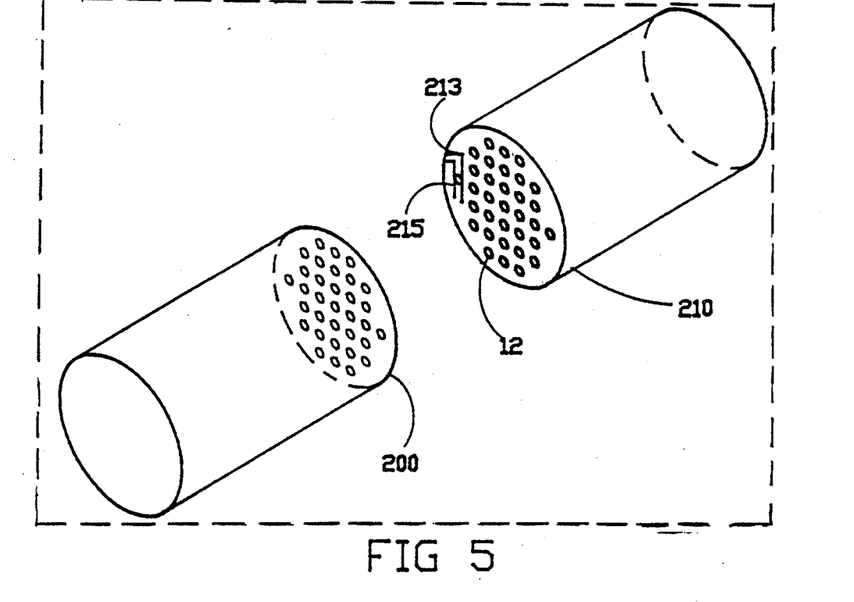
FIG. 5 shows an array of semiconducting metal silicide infra-red detectors arranged in an array to mate with a bundle of optical fibers forming still another embodiment of the present invention.

FIG. 5 shows a bundle of optical fibers 200 which are aligned with and receive signals from a mating array 210 of semiconducting metal silicide sources 12. The direction of transmission can be reversed so that the fiber optics bundle 200 transmit radiation to an array of semiconducting metal silicide detectors 12. While devices can in some cases operate as sources, in practice devices will be optimized for each application as either sources or detectors.

Figure 7:
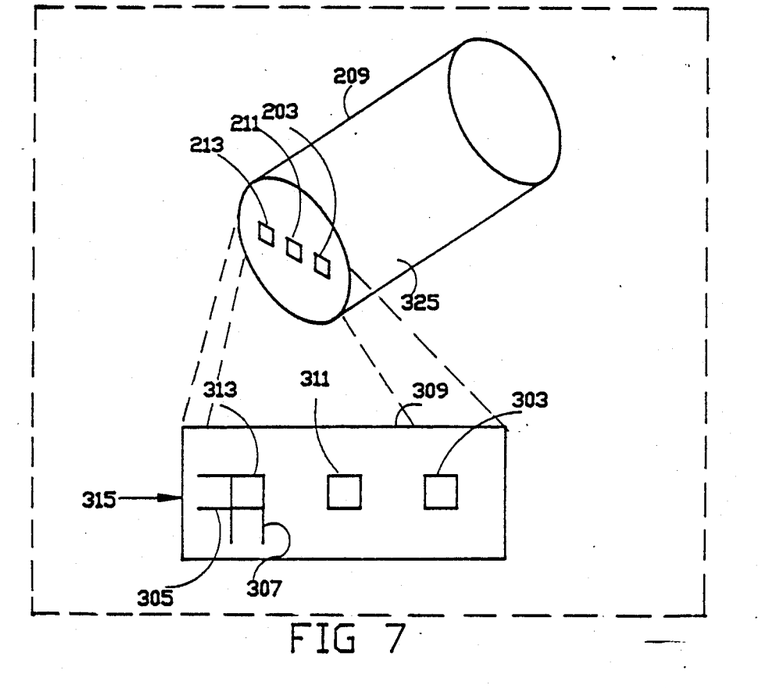
FIG. 7 shows an array of metal silicide semiconducting infra-red detectors arranged to mate with an array of optical fibers forming still another embodiment of the present invention.

FIG. 7 shows a linear array 309 of semiconducting metal silicide detectors 313, 311 and 303 having leads 305 and 307 for receiving current and for connecting to instruments for measuring changed resistance, photocurrent or photovoltage. The array 309 is mated with an array of optical fibers 325 having, for example, three fibers 203, 211 and 214 which align with elements 303, 311 and 313 as shown in the figure.

For instance, while it is known that all of the metal silicides described herein can function as radiation sources, because of the direct band gap of $FeSi_2$, it is apparent that $FeSi_2$ will function as a radiation source.

The functioning of the semiconducting metal silicide devices as interconnecting or intraconnecting devices will facilitate high speed communications and data processing. It is well known that a major limitation to achieve significant speed increases in VLSI has been the inherent limitations in metallic connections.

Figure 8:
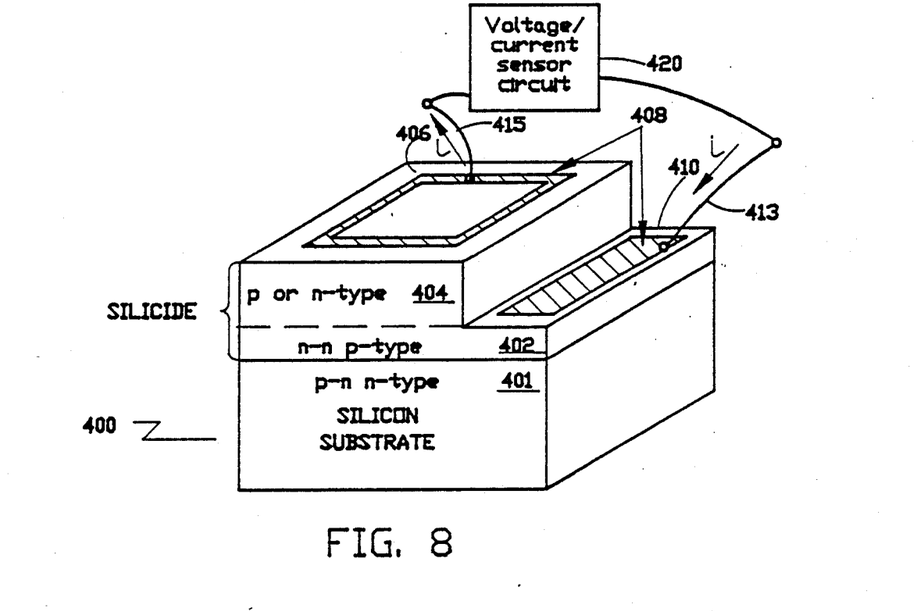
FIG. 8 shows a perspective view of a semiconducting metal silicide homojunction radiation source and detector forming another embodiment of the present invention.

FIG. 8 shows in detail a substrate 401 which can be formed of either p- or n-type silicon and has two layers of either n or p type doped silicide 402 and 404 formed thereon. The upper and lower metal silicide layers must be oppositely doped material and the base should be opposite in doping to the layer adjacent to it as shown in FIG. 8. Part of the upper layer 406 is removed to expose the surface 410 of the lower layer of semiconducting metal silicide 402. Conductive contacts 408 are formed on both surfaces 406 and 410 for permitting electrical connection to the device. Current is injected at lead 413 and removed at lead 415 or vice versa for operation as a source of electromagnetic radiation. When exposed to electromagnetic radiation, the device may generate a photocurrent "1" or alternatively a photovoltage between leads 408 and 406.

Figure 9:
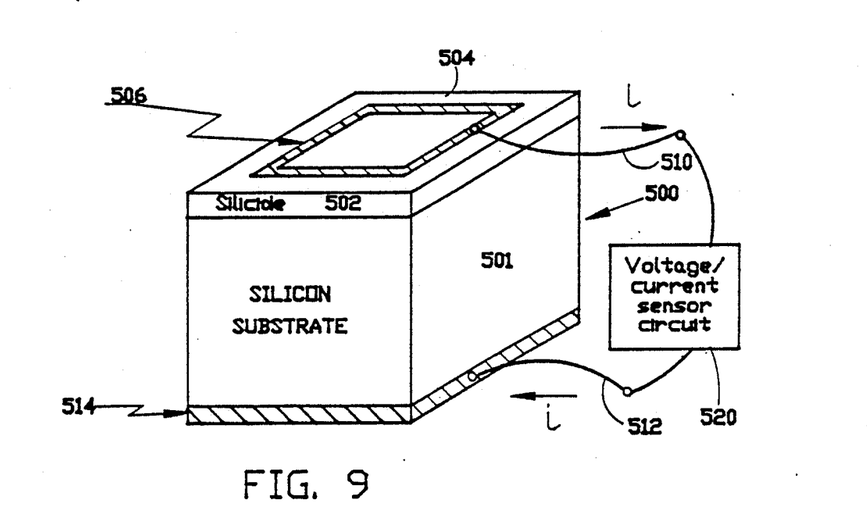
FIG. 9 is a perspective view of a semiconducting metal silicide heterojunction infra-red radiation source and detector forming another embodiment of the present invention.

FIG. 9 shows another embodiment in the form of a heterojunction device 500 having a silicon substrate 501 and a metal silicide thin film 502. Conductive contacts 514 and 516 are formed on the bottom of the substrate and the top of the silicide thin film, respectively. Current is injected at 512 and removed at 510 or vice versa for operation as a source of electromagnetic radiation. When exposed to electromagnetic radiation, the device may generate a photocurrent "i" or alternatively a photovoltage between leads 510 and 517.

Figure 10:
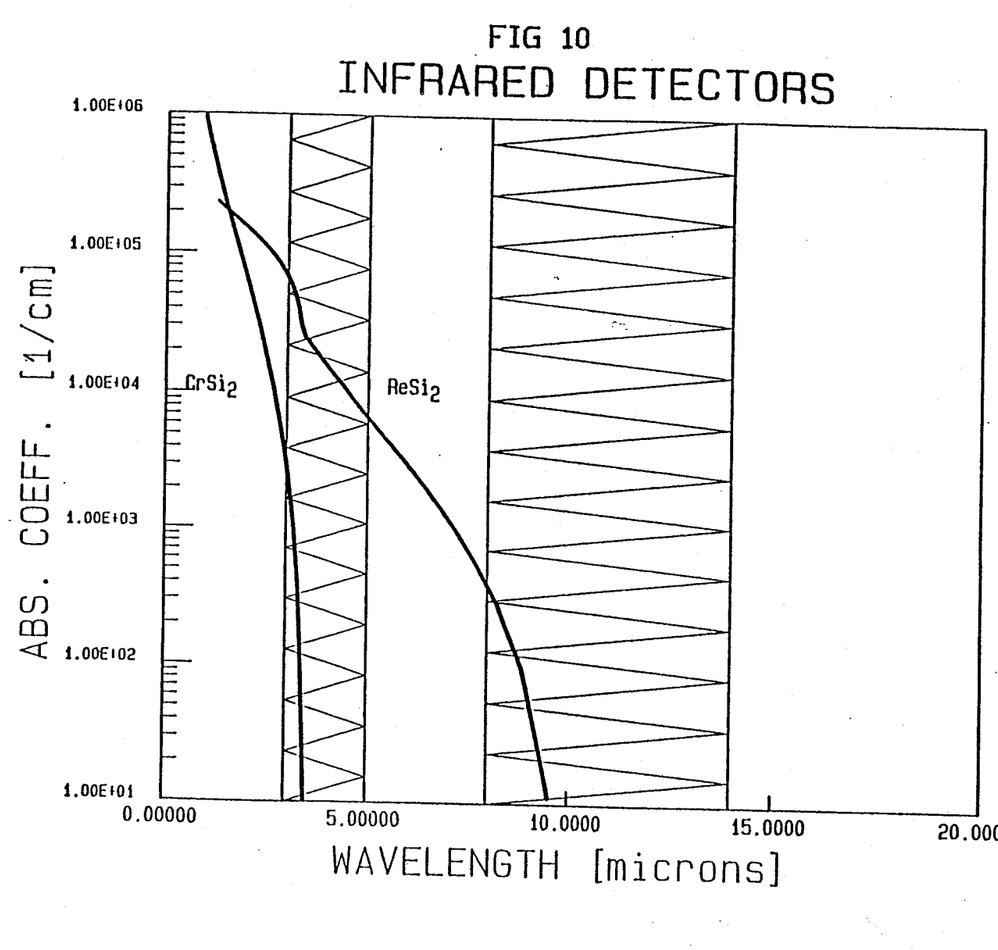
FIG. 10 is a chart showing the optical absorption coefficient of several of the metal silicide semiconductors invented herein as a function of wavelength in microns. The chart also shows some practical wavelength ranges of optical fibers, the atmospheric windows of terrestrial infra-red radiation and NASA's indicated range of interest.

FIG. 10 is a graph showing the optical absorption coefficient for the inventive semiconducting metal silicides as a function of wavelength. Superimposed on the graph are practical wavelength windows of terrestrial infra-red radiation, the windows of transmission of optical fibers and NASA's range of interest for extra-terrestrial instrumentation.

Figure 11:
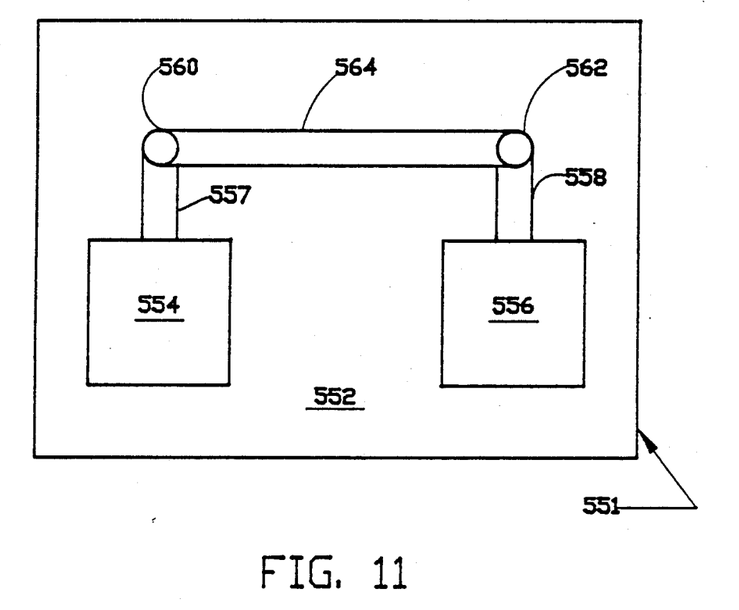
FIG. 11 shows chip intraconnects in which one metal silicide semiconducting device is connected to another metal silicide semiconducting device on the same chip.
Figure 12:
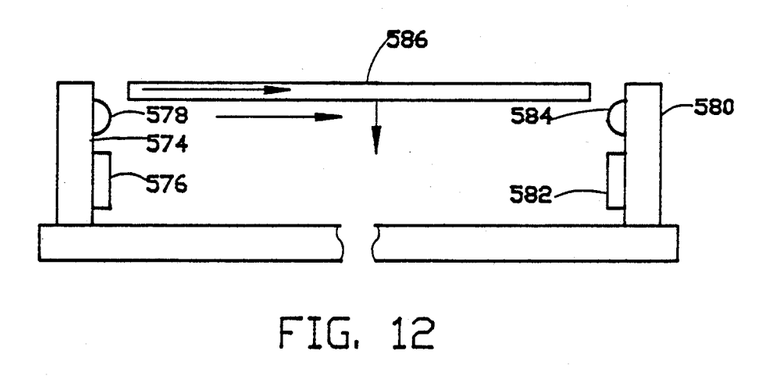
FIG. 12 shows chip interconnects in which one metal silicide semiconducting device is connected to another metal silicide semiconducting device on a different chip with or without the use of a fiber optic line.

FIGS. 11 and 12 show two further embodiments of the present invention. FIG. 11 shows an integrated circuit element 551 formed on a substrate 552, which typically is silicon. Two other circuit elements 554, 556 illustrate circuit elements fabricated on the substrate 552, such circuit elements 554, 556 may, for instance, transfer data from one to the other such as two memory elements. Element 554 conveys its information to radiation source 557 which emits a pulse of energy at output 560 which is carried by waveguide 564 formed monolithically on surface 552 to detector 562 which converts the radiation signal to an electric current through leads 558 which carries it to element 556.

FIG. 12 shows an embodiment similar to that of FIG. 11, except that in FIG. 12 the circuit elements 576, 582 are mounted or formed on separate chips 574, 580. FIG. 11 shows a chip intraconnect; FIG. 12 shows chip interconnects. Interconnected chips 574, 580 include circuit elements 576, 582 and metal silicide devices as both sources and detectors 578, 584. elements, such as memory elements 576, 582. Communication between—574, 580 is achieved, for instance, through photosource 578 and photodetector 584 as described above for FIG. 11. The photosource 578 and photodetector 584 may communicate through an air-gap or through a fiber optic channel 586 which is mounted to interconnect the chips 574, 580. Naturally such communication can be bi-directional.

The thickness of the various film layers varied for each material. Rhenium disilicide layers were formed of thickness of about 307, 461 and 768 angstroms; manganese silicide ($MnSi_{1.7}$) samples were formed with thicknesses ranging from about 1,900 to about 15,100 angstroms. Chromium disilicide samples were formed with layers of about 1,600, 4,300, 5,647 and 13,455 angstroms. These and other thicknesses are shown in the chart produced earlier. In fact, thickness ranging from about 100 angstroms to about 50,000 angstroms should be obtainable.

What I claim is:

1. A method of manufacturing a radiation detector comprising the steps of:
   depositing a first thin film of semiconductive metal silicide on a substrate of opposite doping type of said first thin film;
   depositing a second thin film of semiconductive metal silicide, doped with a type of dopant the same as said substrate, on said first thin film;
   forming a pattern of electrical conductors on said first and said second thin films.

2. A method of manufacturing an infra-red radiation detector comprising the steps of:
   depositing a thin film of semiconductive metal silicide on a silicon substrate;
   forming a first and a second pattern of electrical conductors on said thin film and said silicon substrate respectively.

3. A method of manufacturing an integrated circuit comprising the steps of:
   forming first and second circuits on a substrate where said second circuit receives data from said first circuit;
   forming a first and a second semiconductive metal silicide device having radiation emitting and radiation detecting properties respectively on said substrate;
   electrically connecting said first and said second semiconductive metal silicide devices to said first and said second circuits respectively;
   interconnecting said first and said second semiconductive metal silicide devices to transport said radiation therebetween.

4. A method of manufacturing an integrated circuit comprising the steps of:
   forming first and second circuits on a first and a second substrate respectively where said second circuit receives data from said first circuit;
   forming a first and a second semiconductive metal silicide device having radiation emitting and radiation detecting properties respectively on said first and said second substrates respectively;
   electrically connecting said first and said second semiconductive metal silicide devices to said first and said second circuits respectively;
   interconnecting said first and said second semiconductive metal silicide devices to transport said radiation therebetween.

* * * * *